United States Patent
Pfeffer et al.

(10) Patent No.: US 10,892,387 B2
(45) Date of Patent: Jan. 12, 2021

(54) LIGHTING DEVICE WITH SWITCHING MATERIAL

(71) Applicant: Lumileds Holding B.V., Schiphol (NL)

(72) Inventors: Nicola Bettina Pfeffer, Eindhoven (NL); Arjen Van Der Sijde, Eindhoven (NL); Marcel Bohmer, Eindhoven (NL)

(73) Assignee: Lumileds, LLC, San Jose, CA (US)

( * ) Notice: Subject to any disclaimer, the term of this patent is extended or adjusted under 35 U.S.C. 154(b) by 7 days.

(21) Appl. No.: 16/228,393

(22) Filed: Dec. 20, 2018

(65) Prior Publication Data

US 2019/0195456 A1   Jun. 27, 2019

Related U.S. Application Data

(60) Provisional application No. 62/609,202, filed on Dec. 21, 2017.

(30) Foreign Application Priority Data

Mar. 19, 2018 (EP) .................................. 18162551
Aug. 28, 2018 (EP) .................................. 18191100

(51) Int. Cl.
*H01L 33/58* (2010.01)
*H01L 27/15* (2006.01)
(Continued)

(52) U.S. Cl.
CPC ............ *H01L 33/58* (2013.01); *F21S 41/141* (2018.01); *F21S 41/40* (2018.01); *F21V 14/003* (2013.01);
(Continued)

(58) Field of Classification Search
CPC . H01L 33/58; H01L 25/0753; H01L 51/5284; H01L 27/156; H01L 33/50;
(Continued)

(56) References Cited

U.S. PATENT DOCUMENTS

| 5,867,238 A | 2/1999 | Miller et al. |
| 5,916,837 A * | 6/1999 | Harmer .................... B01J 21/08 |
| | | 502/151 |

(Continued)

FOREIGN PATENT DOCUMENTS

| CN | 106019688 A | 10/2016 |
| CN | 106707595 A | 5/2017 |

(Continued)

OTHER PUBLICATIONS

"International Application Serial No. PCT/EP2018/085445, International Search Report dated Feb. 4, 2019", 3 pgs.

(Continued)

*Primary Examiner* — Isiaka O Akanbi
*Assistant Examiner* — Glenn D Zimmerman
(74) *Attorney, Agent, or Firm* — Schwegman Lundberg & Woessner, P.A.

(57) ABSTRACT

A lighting device comprises a light-emitting module with light-emitting elements, wherein the light-emitting elements are arranged adjacent to each other and are configured to emit light towards a light-emitting side. The light-emitting module is configured such that the light-emitting elements can be addressed partially independently of each other, such that some may be brought into a switched-on state while others are brought into a switched-off state. A top layer is disposed on the light-emitting module at the light-emitting side. Further comprising a switching material capable of a reversible change in transmittance for the light emitted by changing to a higher transmittance in regions where the top layer situated on light-emitting elements in the switched-on state or to a lower transmittance in regions of the top layer situated in the switched-off state. The invention further refers to methods for producing and operating a lighting device and using a lighting device.

21 Claims, 3 Drawing Sheets

(51) Int. Cl.
| | |
|---|---|
| *H01L 33/50* | (2010.01) |
| *G02F 1/01* | (2006.01) |
| *G02F 1/163* | (2006.01) |
| *H01L 25/075* | (2006.01) |
| *H01L 51/52* | (2006.01) |
| *G02F 1/015* | (2006.01) |
| *F21S 41/141* | (2018.01) |
| *F21S 41/40* | (2018.01) |
| *F21V 14/00* | (2018.01) |
| *F21S 41/64* | (2018.01) |
| *F21V 23/00* | (2015.01) |
| *F21V 23/02* | (2006.01) |
| *F21Y 115/10* | (2016.01) |

(52) U.S. Cl.
CPC ............ *G02F 1/015* (2013.01); *G02F 1/0126* (2013.01); *G02F 1/0147* (2013.01); *G02F 1/163* (2013.01); *H01L 25/0753* (2013.01); *H01L 27/156* (2013.01); *H01L 33/50* (2013.01); *H01L 51/5284* (2013.01); *F21S 41/64* (2018.01); *F21S 41/645* (2018.01); *F21V 23/005* (2013.01); *F21V 23/02* (2013.01); *F21Y 2115/10* (2016.08); *G02F 2203/01* (2013.01); *G02F 2203/02* (2013.01); *G02F 2203/03* (2013.01); *H01L 2933/0091* (2013.01)

(58) Field of Classification Search
CPC . H01L 2933/0091; F21S 41/141; F21S 41/40; F21S 41/645; F21S 41/64; F21V 14/003; F21V 23/005; F21V 23/02; G02F 1/0147; G02F 1/163; G02F 1/0126; G02F 2203/02; G02F 2203/01; G02F 2203/03; G02F 1/015; F21Y 2115/10
See application file for complete search history.

(56) References Cited

U.S. PATENT DOCUMENTS

| | | | |
|---|---|---|---|
| 9,117,776 | B2 | 8/2015 | Kim et al. |
| 9,159,890 | B2 | 10/2015 | Moosburger et al. |
| 9,431,635 | B2 | 8/2016 | Heuser et al. |
| 9,508,908 | B2 | 11/2016 | Vampola et al. |
| 9,857,049 | B2 | 2/2018 | Chung et al. |
| 9,891,350 | B2 | 2/2018 | Lofftus et al. |
| 2008/0187746 | A1 | 8/2008 | De Graaf et al. |
| 2009/0212697 | A1 | 8/2009 | Nakamura et al. |
| 2011/0141544 | A1* | 6/2011 | Suzuki ............... C09K 9/02 359/273 |
| 2014/0043668 | A1* | 2/2014 | Bergh ............... E06B 9/24 359/265 |
| 2014/0098547 | A1* | 4/2014 | Kostelnik ........... H03K 17/955 362/311.02 |
| 2014/0246690 | A1* | 9/2014 | Moosburger .......... G03B 15/02 257/98 |
| 2014/0376076 | A1* | 12/2014 | Chen ............... F21S 41/645 359/275 |
| 2015/0036373 | A1* | 2/2015 | Chen ............... F21S 41/645 362/516 |
| 2015/0277164 | A1* | 10/2015 | Nagase ............. G02F 1/133536 349/33 |
| 2016/0293682 | A1* | 10/2016 | Park ................. H01L 51/5275 |
| 2017/0012026 | A1 | 1/2017 | Choi |
| 2017/0075314 | A1* | 3/2017 | Perez-Feliciano ..... G04B 47/00 |
| 2017/0212398 | A1* | 7/2017 | Cao ................. G02F 1/1333 |
| 2017/0310956 | A1* | 10/2017 | Perdices-Gonzalez ...... G09G 3/3208 |
| 2017/0337031 | A1* | 11/2017 | Kaufmann ............ F21V 15/01 |
| 2018/0138430 | A1* | 5/2018 | Chu ................. G02F 1/0147 |
| 2019/0016907 | A1* | 1/2019 | Kagan ............... G03G 9/131 |
| 2019/0198732 | A1 | 6/2019 | Shimizu et al. |

FOREIGN PATENT DOCUMENTS

| | | | | |
|---|---|---|---|---|
| DE | 102013101530 A1 | 8/2014 | | |
| GB | 2433640 A | 6/2007 | | |
| JP | 2004-239935 A | 8/2004 | | |
| KR | 20150069364 A | 6/2015 | | |
| WO | 2016/190855 A1 | 12/2016 | | |
| WO | WO-2016190855 A1 * | 12/2016 | ......... | H01L 51/5268 |
| WO | 2017/014926 A1 | 1/2017 | | |
| WO | 2017/104313 A1 | 6/2017 | | |
| WO | WO-2017157473 A1 * | 9/2017 | .......... | G03G 9/0804 |
| WO | 2017/134589 A1 | 10/2017 | | |
| WO | 2017/222298 A1 | 12/2017 | | |
| WO | WO-2019/121650 A1 | 6/2019 | | |
| WO | WO-2019/126701 A1 | 6/2019 | | |

OTHER PUBLICATIONS

"International Application Serial No. PCT/EP2018/085445, Written Opinion dated Feb. 4, 2019", 7 pgs.

"International Application Serial No. PCT US2018 067193, International Search Report dated Mar. 6, 2019", 4 pgs.

"International Application Serial No. PCT US2018 067193, Written Opinion dated Mar. 6, 2019", 7 pgs.

U.S. Appl. No. 16/226,487, filed Dec. 19, 2018, Light Intensity Adaptive LED Sidewalls.

* cited by examiner

LIGHTING DEVICE WITH SWITCHING MATERIAL

FIELD OF INVENTION

The present disclosure relates to lighting devices comprising a light-emitting module, wherein light-emitting elements such as light emitting diodes (LEDs) are arranged adjacent to each other and are configured to be addressed independently of each other.

BACKGROUND

Lighting devices may comprise an arrangement of multiple light-emitting elements, for example LEDs or LED packages. For some applications, so-called "segmented LEDs" have been proposed, wherein the LEDs are configured to be addressed at least partially independently of each other in that some LEDs may be brought into a switched-on state while other LEDs remain in a switched-off state. That is, segments of the lighting device may be activated while other segments are inactive. With this, the total intensity of the light emitted by the lighting device can be varied, as well as the shape of light and the intensity distribution. In case LEDs with different colors are used, the segmented LEDs may also provide a variation in color for the emitted light.

Light-emitting elements such as LEDs typically have a certain amount of lateral light diffusion. While a light-emitting element may be configured to emit the light substantially in one direction, e.g. from a light-emitting side or face, part of the light is also emitted towards other directions. Light-emitting elements such as LEDs or LED packages are also usually provided with architectures that comprise elements like substrates, wavelength conversion elements, and diffusing layers. Such architectures may lead to a scattering of light emitted by the LED away from the light-emitting side and therefore increase the amount of lateral light diffusion.

Lateral light diffusion may in particular become problematic when light-emitting elements are arranged adjacent to each other, for instance in segmented LEDs. In case the segmented LED is only partially activated, light from active segments may reach inactive segments. Therefore, light not only appears from the active segments, but also appears with lesser intensity from neighboring, inactive segments. As a result, a "leaking" of light or undesired cross talk between the segments appears, reducing the intensity contrast of the lighting device. When light conversion elements are provided, the light conversion elements of inactive segments may be illuminated by the active segments, leading to undesired color differences between the segments. In segmented LEDs comprising segments providing different colors, a loss in color contrast can also occur.

A possibility to reduce the loss in contrast due to lateral light diffusion is to provide reflective elements in between the individual light-emitting elements or the individual segments. However, such reflective elements usually restrict the spacing between the light-emitting elements in that the light-emitting elements have to be arranged with a certain minimum distance to accommodate the reflective elements. In addition, the production costs are increased, as additional elements need to be incorporated into the lighting device.

WO 2017/134589 A1 discloses a coating comprising vanadium oxide doped with one or several elements and at least germanium.

U.S. Pat. No. 9,857,049 B2 relates to an LED illumination device with a carrier structure, a suspension structure, and a light-emitting structure.

WO 2017/104313 A1 describes an optical film which contains vanadium dioxide containing particles, wherein the near-infrared shielding rate is adjusted in accordance with the temperature environment.

U.S. Pat. No. 9,117,776 B2 relates to an organic light-emitting display with a color-changing material layer provided on a display panel.

U.S. Pat. No. 9,431,635 B2 describes a light-emitting component including an electrically active region with an organic functional layer structure. A thermotropic layer is arranged outside the electrically active region.

SUMMARY

It is an object of the present invention to provide a lighting device with light-emitting elements that can be addressed independently of each other, which enhances the contrast of the illumination between light-emitting elements in a switched-on state and light-emitting elements in a switched-off state. The invention further relates to a method for producing such a lighting device and a use of such a lighting device based on the aforementioned object.

According to a first aspect of the present invention, a lighting device is provided, comprising: an light-emitting module with light-emitting elements, wherein the light-emitting elements are arranged adjacent to each other and are configured to emit light towards a light-emitting side, wherein the light-emitting module is configured such that the light-emitting elements can be addressed at least partially independently of each other in that some of the light-emitting elements may be brought into a switched-on state while other light-emitting elements may be brought into a switched-off state; and a top layer disposed on the light-emitting module at the light-emitting side, wherein the top layer comprises a switching material capable of a reversible change in transmittance for the light emitted by the light-emitting elements, and wherein the top layer is configured to change to a higher transmittance in regions of the top layer situated on light-emitting elements in the switched-on state compared to a transmittance in regions of the top layer situated on light-emitting elements in the switched-off state.

According to a second aspect of the present invention, a method for producing a lighting device is provided, in particular the lighting device according to the first aspect, the method comprising: providing a light-emitting module by arranging light-emitting elements adjacent to each other such that the light-emitting elements emit light towards a light-emitting side, wherein the light-emitting module is configured such that the light-emitting elements can be addressed independently of each other in that some of the light-emitting elements may be brought into a switched-on state while other light-emitting elements may be brought into a switched-off state; providing a top layer, wherein the top layer comprises a switching material capable of a reversible change in transmittance for the light emitted by the light-emitting elements; and disposing the top layer on the light-emitting module at the light-emitting side, wherein the top layer is configured to change to a higher transmittance in regions of the top layer situated on light-emitting elements in the switched-on state compared to a transmittance in regions of the top layer situated on light-emitting elements in the switched-off state.

According to a third aspect of the present invention, a method for operating a lighting device according to the first aspect is provided, the method comprising: bringing some of the light-emitting elements into a switched-on state while bringing other light-emitting elements into a switched-off state; and changing the top layer to a higher transmittance in regions of the top layer situated on light-emitting elements in the switched-on state compared to a transmittance in regions of the top layer situated on light-emitting elements in the switched-off state.

According to a fourth aspect of the present invention, a use of a lighting device according to the first aspect is provided as camera flash light or in automotive lighting, in particular as automotive headlight.

Exemplary embodiments of the first, second, third, and fourth aspect of the invention may have one or more of the properties described below.

The light-emitting module may comprise an arrangement of light-emitting elements, wherein the light-emitting elements are arranged adjacent to each other. In particular, an array of light-emitting elements is provided, for example a one-dimensional or 1×N array, in that multiple light-emitting elements are arranged adjacent to each other along one direction. The light-emitting elements may also be arranged as two-dimensional array with light-emitting elements being arranged adjacent to each other on a surface or a plane, for instance configurations like 3×3 or 3×2 arrays of light-emitting elements. Arrays of light-emitting elements may also be larger, e.g. arrays of 3×7 or 5×40 light-emitting elements are possible, in particular for automotive applications. Arrays of light-emitting elements may be regular in that the distances between neighboring light-emitting elements are similar. Arrays of light-emitting elements may also comprise light-emitting elements of different sizes, e.g. with different segments being formed of light-emitting elements of different sizes.

Under the light-emitting elements being arranged "adjacent to each other", it may be understood that each light-emitting element is brought close enough to another light-emitting element so that a cross-talk between light-emitting elements due to lateral light diffusion is substantial. In particular, the minimal distance between light-emitting elements may be in the same order of magnitude or less than the dimension of a light-emitting face of the light-emitting elements. For instance, the dimensions of the light-emitting face of the light-emitting elements, in particular LEDs may be in the order of millimeters, and in particular 1 $mm^2$ to 100 $mm^2$, for example about 1.5 mm×1.5 mm. The distances between neighboring light-emitting elements may be less than 1 mm, in particular less than 0.5 mm. In some embodiments, at least part of the light-emitting elements may be arranged such that side faces of the light-emitting elements are in direct contact or abut to each other.

The light-emitting elements are arranged such that the light-emitting elements emit light towards a light-emitting side. For example, the light-emitting elements have a light-emitting face, with the light-emitting faces of several light-emitting elements in the light-emitting module facing substantially in the same direction. In particular, the light-emitting elements of the light-emitting module are arranged substantially on the same surface, for example on the same substrate, and may in particular be arranged in the same plane.

The light-emitting elements may in particular comprise at least one semiconductor element capable of light emission. In particular, at least one light-emitting element may comprise at least one LED. LEDs may comprise at least one semiconductor element such as a p-n-junction, a diode, and/or a transistor. For instance, the LEDs may be provided in form of separate or combined LED dies and/or LED packages, wherein particular at least one LED may be arranged on a substrate, e.g. a sapphire substrate. An LED package may comprise a wavelength conversion element (e.g. based on phosphor) and/or may comprise at least one optical element such as a diffusing layer, a diffractive element (e.g. a lens) and/or a reflective element (e.g. a reflector cup). The LED or LEDs may for instance be integrated into an LED lead frame. The LEDs are in particular based on inorganic compounds. In other embodiments, the LEDs may be based on organic compounds, for instance in the form of OLEDs. In some embodiments, different types of LEDs providing different colors are used.

The light-emitting elements may also be based on other light sources such as lasers. For instance, lasers can be used, in particular to pump wavelength conversion elements (e.g. based on phosphor) with light. Lasers may for instance be based on laser diodes or edge-emitting lasers. In particular, vertical-cavity surface-emitting lasers (VCSEL) may be used, such as VCSEL arrays.

The light-emitting elements are configured to be addressed at least partially independently of each other in that some of the light-emitting elements may be brought into a switched-on state while other light-emitting elements are brought into a switched-off state. Therefore, the lighting device may provide an illumination in segments of light-emitting elements, wherein the illumination can be varied by bringing different segments of light-emitting elements into the switched-on state. "Bringing" into a switched-off state or switched-on state may also mean that the current state of an light-emitting element is maintained, while the state of at least one other light-emitting element is changed.

The light-emitting module in particular comprises electrical contacts for the light-emitting elements and electrical conduction elements, e.g. wiring and/or printed circuit boards for providing a contact of the light-emitting elements to a power source. The electrical contacts for the light-emitting elements and/or electrical conduction elements may be configured such that at least part of the light-emitting elements can be addressed independently, i.e. at least part of the light-emitting elements can be provided with energy independently from each other. In some embodiments, the lighting device may comprise control means for controlling the independent addressing of the light-emitting elements. In some embodiments, light-emitting elements may be grouped, wherein the groups of light-emitting elements may be addressed independently of each other. In other embodiments, all of the light-emitting elements of the light-emitting module are configured to be addressed independently of each other.

Light-emitting elements that are configured to be addressed independently of each other may be provided based on separate components, e.g. separate semiconductor elements such as separate LEDs and/or separate LED packages. In other embodiments, at least some of the light-emitting elements are formed together in a monolithic element, e.g. a monolithic semiconductor element like a monolithic LED die with independently addressable segments. "Light-emitting elements" may in this sense also refer to an (e.g. monolithic) element that is capable of emitting light from sections that can be addressed independently of each other.

A top layer is disposed on the light emitting module at the light-emitting side, such that the light emitted by the light-emitting elements, in particular by a light-emitting face of the light-emitting elements, at least partially passes the top layer for illumination when the lighting device is activated.

As the top layer comprises a switching material capable of a reversible change in transmittance for the light emitted by the light-emitting elements, the contrast between light-emitting elements in the switched-on state and light-emitting elements in the switched-off state can be enhanced. With the switching material, the top layer is configured to change to a higher transmittance in regions of the top layer situated on light-emitting elements in the switched-on state compared to a transmittance in regions of the top layer situated on light-emitting elements in the switched-off state. That is, the transmission of light in regions of the top layer situated on light-emitting elements in the switched-off state is effectively reduced or blocked compared to regions of the top layer situated on light-emitting elements in the switched-on state. Therefore, light leaking from light-emitting elements in the switched-on state to light-emitting elements in the switched-off state, e.g. by lateral light diffusion caused by lateral emission, total internal reflection inside the elements (e.g. an effective light guiding in a layered structure of the light-emitting elements) and/or scattering, is at least partially blocked at the top layer in the regions of the light-emitting elements in the switched-off state. As a result, a transmission of light mostly occurs in the regions of the top layer on light-emitting elements in the switched-on state.

The transmittance of the top layer may in particular be understood as the fraction of incident light transmitted through the top layer. The incident light may be the light emitted by the light-emitting element impinging on a first side of the top layer, with part of the light being transmitted to a second side of the top layer opposite of the first side. The transmission may be understood as total transmittance, i.e. the ratio of incident electromagnetic energy that is not absorbed, scattered or reflected such that it is transmitted. For example, the switching material may be capable of a reversible change in the scattering of light, in the color of the transmitted light, and/or in the absorption of light, e.g. a change from black to transparent or translucent.

In particular, when the transmittance is measured in percent (with 0% corresponding to no electromagnetic energy of an light-emitting element passing the top layer and 100% corresponding to all electromagnetic energy of an light-emitting element passing the top layer), the top layer may be configured to change transmittance by at least 10%, in particular by at least 30%. In some embodiments, the top layer may be configured to change transmittance by at least 70%, in particular by at least 80%.

In an exemplary embodiment of the invention, the regions of the top layer situated on light-emitting elements in the switched-on state have translucent properties. In particular, the switching material may be configured for a reversible change from substantially opaque properties to translucent properties. With the translucent properties of the regions of the top layer, the light emitted by the light-emitting elements in the switched-on state and transmitted through the top layer is scattered to obtain a more diffuse and softer illumination. In some embodiments, one or more additional diffusion layers on the light-emitting elements such as LEDs and/or LED packages can therefore be omitted, simplifying the production of the lighting device.

In another exemplary embodiment of the invention, the switching material comprises at least one thermochromic material. Thermochromic materials may change transmittance depending on temperature, such that the transmittance of the regions of the top layer may be changed based on a variation of temperature. In particular, thermochromic materials may be configured to increase transmittance with increasing temperature. Regions of the top layer on light-emitting elements in the switched-on state may therefore be configured to be heated and/or regions of the top layer on light-emitting elements in the switched-off state may be configured to be cooled to change the transmittance.

A heating and/or cooling of regions may be active in the sense that heating means and/or cooling means are provided, which are capable of controlling the temperature of regions of the top layer. The heating means and/or cooling means may be controlled together with the addressing of the light-emitting elements, for example by control means. A heating of regions may also be passive in the sense that waste heat of other elements of the lighting device is used.

In particular, the light-emitting elements in the switched-on state may produce heat and transfer heat to the top layer in the corresponding regions. The light-emitting elements may transfer heat by convection to the top layer. Heat conduction elements may also be provided, for example in that heat sinks of the light-emitting elements are connected to the top layer. In particular when LEDs are used as light-emitting elements, a substantial waste heat may be produced that can be used to provide heat to the top layer. LEDs with wavelength conversion elements such as white LEDs comprising phosphor layers may produce a suitable amount of heat due to the conversion of higher photon energies to lower photon energies.

In an exemplary embodiment of the invention, the at least one thermochromic material is configured to increase transmittance at temperatures corresponding to an operating temperature of the light-emitting elements. For example, the temperature range in which the transmittance of the thermochromic material has the highest change may correspond to the temperature range of the top layer caused by the operation of the light-emitting elements. With this, the change in transmittance can be induced by the waste heat of the light-emitting elements themselves such that the top layer automatically changes the transmittance in regions to enhance the contrast. Typical temperature ranges depend on the application and the overall heatsinking of the lighting device. The temperature range particularly suitable for applications like camera flash or other application requiring higher currents may be 100° C. to 250° C., in particular 150° C. to 230° C. Other applications may work at lower temperatures, e.g. 50° C. to 150° C.

In another exemplary embodiment of the invention, the at least one thermochromic material comprises at least one leuco dye and/or at least one metal oxide. At least one leuco dye can be chosen from a group of dyes based on triphenyle methane, sulfur dyes, and indigo dyes. Dyes based on triphenyle methane may comprise such dyes as aniline green, malachite green, and/or china green. Sulfur dyes may in particular be obtained from aromatic compounds reacted with sodium polysulfide, e.g. sulfur black, sulfur blue, and sulfur yellow. Indigo dyes may be obtained from natural sources. A further type of leuco dye as thermochromic material is crystal violet lactone leuco dye (CVL).

Metal oxides may also have thermochromic properties, and in particular transition metal oxides such as $VO_2$ may be used.

Different types of thermochromic materials may be combined for the top layer, e.g. a mixture of different leuco dyes, to obtain a high change in transmittance in a suitable temperature range, a certain color for the top layer, and/or translucent or transparent properties of the top layer.

In another exemplary embodiment of the invention, the switching material comprises at least one electrochromic material. The top layer may be configured such that voltage may be applied to regions of the top layer to change transmittance by means of the at least one electrochromic material.

In an exemplary embodiment of the invention, the at least one electrochromic material is configured to change to a higher transmittance when a voltage is applied to the top layer. Hence, voltage may be applied to the regions of the top layer on the light-emitting elements in the switched-on state to provide a higher contrast and to avoid cross-talk of the light-emitting elements. Conversely, the at least one electrochromic material may be configured to change to a lower transmittance when a voltage is applied to the top layer. Voltage may be applied to the regions of the top layer on the light-emitting elements in the switched-off state or at least to regions of the top layer adjacent to the regions of the top layer on the light-emitting elements in the switched-on state. In particular, connection elements for providing the light-emitting elements with electrical energy may also be connected to the top layer, and provide a voltage to corresponding regions of the top layer.

In another exemplary embodiment of the invention, the at least one electrochromic material comprises at least one selected from a group comprising metal oxides, metal hydroxides, viologens, conjugated polymers, metal coordination complexes, metal hexacyanometallates, and metal pthalocyanines. Electrochromic metal oxides can for example be chosen from a group of $WO_3$, $NiO$, $MoO_3$, $V_2O_5$, and $Nb_2O_5$. An example for a metal hydroxide is $Ir(OH)_3$. The electrochromic material may for example be based on viologens such as polymeric viologens, ethyl viologen, heptyl viologen, and/or (vinyl) benzyl viologen. As conjugated polymer, in particular conjugated conducting polymers may be used, for example polypyrrole, polythiophene, and/or polyaniline (PANI). Metal coordination complexes and/or metallopolymers may include Mo, Fe, Ru, Os complexes in particular based on pyridines. Metal hexacyanometallates may comprise Prussian blue and/or Ruthenium purple. Examples for metal pthalocyanines are $[Lu(Pc)_2]$ and Co(II) pthalocyanine.

In another exemplary embodiment of the invention, the switching material is encapsulated. For example, switching material like leuco dyes may be encapsulated and in particular microencapsulated. For instance, capsules with an inner section containing the switching material and an outer section comprising a protective material may be provided. The switching material may be encapsulated in capsules with an average dimension of 1 μm to 50 μm, in particular 5 μm to 10 μm. Capsules may be substantially spherical. It also possible that the switching material, e.g. leuco dyes, are encapsulated by disposing the switching material into a porous structure. Encapsulated switching material may in particular be integrated into the top layer. In addition or as an alternative, switching material may be provided as a coating on the top layer. A coating comprising switching material is applied on one or both sides of the top layer. A coating may be applied as a slurry, powder, solvent-based ink, resin such as a silicone, and/or based on a master batch comprising the switching material.

In an exemplary embodiment of the invention, the switching material is capable of a reversible change in light scattering for the light emitted by the light-emitting elements. In an exemplary embodiment, the switching material may comprise a porous structure, the porous structure comprising: a non-light absorbing material structure comprising a plurality of sub-micron pores; and a polymer matrix, wherein the polymer matrix fills the plurality of sub-micron pores, creating an interface between the non-light absorbing material structure and the polymer matrix, a refractive index of the non-light absorbing material structure is different than a refractive index of the polymer matrix at a first temperature, a refractive index difference between the refractive index of the non-light absorbing material structure and the refractive index of the polymer matrix is such that the plurality of sub-micron pores within the optically functional porous structure has a light scattering ability at the first temperature, and the refractive index difference between the refractive index of the non-light absorbing material structure and the refractive index of the polymer matrix decreases at a second temperature, such that the light scattering ability of the plurality of sub-micron pores decreases. The polymer matrix may in particular be based on silicone.

With the refractive index of the polymer matrix being greater than the refractive index of the non-light absorbing material structure, a light scattering effect occurs at the interface between the two materials. As the temperature changes to the second temperature, the refractive index of the polymer matrix decreases such that the refractive index difference between the non-light absorbing material, which outlines the shape of the sub-micron pores, and that of the polymer matrix, which fills the sub-micron pores, decreases thereby resulting in decreased to no light scattering by the sub-micron pores-dielectric surface interface. Hence, corresponding porous structures may provide a reversible change in transmittance and may be used as switching material.

In particular, the refractive index of the non-light absorbing material structure is less than the refractive index of the polymer matrix at the first temperature, and the second temperature is greater than the first temperature, such that for instance waste heat of the light-emitting elements may induce a reduction in scattering and therefore an increase in transmittance.

In an exemplary embodiment of the invention, the switching material comprises porous silica. In particular, the non-light absorbing material structure of a porous structure is formed from porous silica. The non-light absorbing material structure may form a plurality of micron-sized porous particles dispersed throughout the porous structure, wherein the plurality of sub-micron pores are located within the plurality of micron-sized porous particles. The plurality of micron-sized porous particles may for instance have a diameter of 10 μm to 50 μm. Each sub-micron pore of the plurality of sub-micron pores may have an internal diameter of 50 nm to 400 nm.

In some embodiments, the non-light absorbing material structure forms a mesh slab comprising an interconnected network of the plurality of sub-micron pores. The porous structure may also further comprise air voids, wherein a space occupied by the air voids decreases as the polymer matrix thermally expands, decreasing light scatter, and the space occupied by the air voids increases as the polymer matrix shrinks, increasing light scatter.

In other embodiments with the switching material being capable of a reversible change in light scattering, the switching material may comprise scattering elements based on $MgF_2$, wherein the scattering elements in particular be embedded in a matrix material, e.g. a matrix material based on dimethylsilicone.

In another exemplary embodiment of the invention, the light-emitting module further comprises at least one light-blocking element arranged between the light-emitting elements. The at least one light-blocking element may be configured as reflective or absorbing element in between the light-emitting elements to further reduce the amount of light leaking from light-emitting elements in the switched-on state to light-emitting elements in the switched-off state.

In some embodiments of the invention, the lighting device is configured as camera flash light. In particular in adaptive flash lighting, addressing different segments of light-emitting elements such as segments of LEDs independently may be used for an optimized illumination. For instance, the lighting device may be used in the field of photography to provide additional lighting with a variable brightness. In automotive lighting and in particular as automotive headlight, the lighting device may be used for a variable illumination. With the lighting device according to the invention, the illumination may be optimized for high visibility while reducing the risk of glaring.

When operating the lighting device according to the invention, some of the light-emitting elements may be brought into a switched-on state, i.e. certain segments are addressed. The remaining light-emitting elements may be kept in or brought into a switched-off state, such that a segmented illumination with a contrast between active and inactive segments is obtained. The top layer may be changed to a higher transmittance in regions of the top layer situated on light-emitting elements in the switched-on state compared to a transmittance in regions of the top layer situated on light-emitting elements in the switched-off state. The change in transmittance of the top layer may be active, for instance by application of voltage to a top layer comprising electrochromic materials. The change in transmittance may also be induced by the light-emitting elements, for instance by means of waste heat that induces a change in transmittance of a top layer comprising at least one thermochromic material.

The features and example embodiments of the invention described above may equally pertain to the different aspects according to the present invention. In particular, with the disclosure of features relating to the lighting device according to the first aspect, also corresponding features relating to the methods according to the second and third aspect and to the use according to the fourth aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWINGS

Examples of the invention will now be described in detail with reference to the accompanying drawing, in which.

DETAILED DESCRIPTION OF THE PREFERRED EMBODIMENTS

Figure 1:
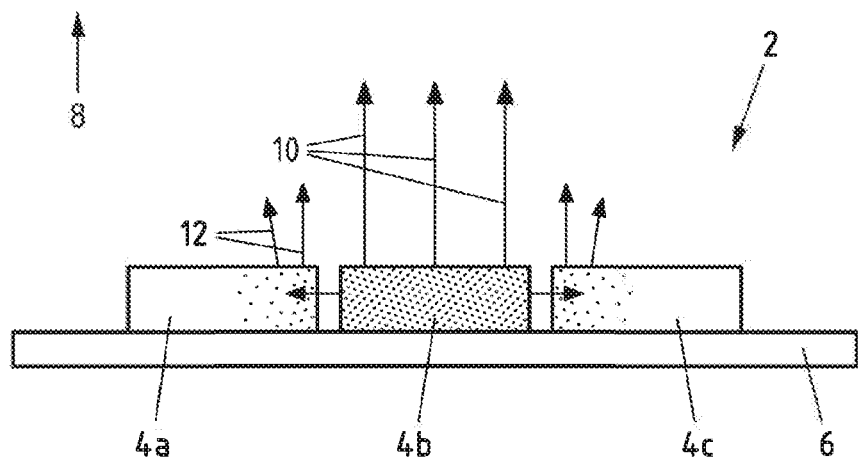
FIG. 1 shows a schematic representation of a lighting device from a side view.
Figure 2:
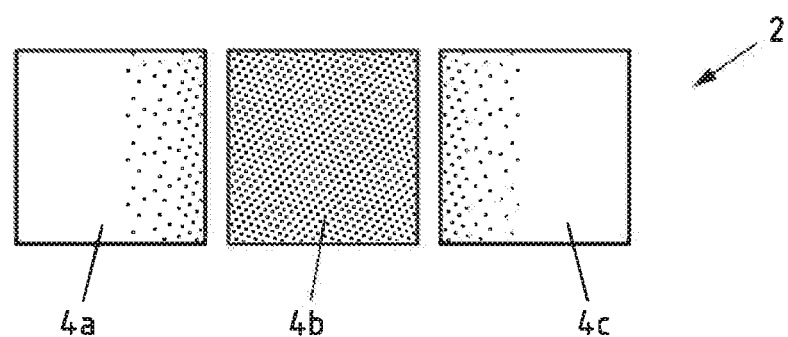
FIG. 2 shows a schematic representation of the lighting device of FIG. 1 from a top view.

FIG. 1 shows a schematic representation of a lighting device 2 from a side view. LEDs 4a-4c are arranged adjacent to each other on a substrate 6 and are configured to emit light towards a light-emitting side 8. The lighting device 2 is also shown in FIG. 2 from a top view. The LEDs 4a-4c are forming a segmented LED module and can be addressed independently of each other in that some of the LEDs 4a-4c may be brought into a switched-on state while other LEDs 4a-4c are brought into a switched-off state. In FIGS. 1 and 2, LED 4b is in the switched-on state and emits light as indicated by the arrows 10, while LEDs 4a and 4c are in the switched-off state and inactive.

The LEDs 4a-4c are affected by lateral light diffusion, as light emitted by the LEDs 4a-4c is not only emitted towards the light emitting side 8, but may also be laterally emitted, reflected and/or scattered away from the light-emitting side 8. As the LEDs 4a-4c are arranged adjacent to each other, light may leak from active segments to inactive segments. As a consequence, light 10 appears not only as being emitted from the LED 4b in the switched-on state. Also parts of the inactive LEDs 4a and 4c appear illuminated with light 12. Therefore, a light cross talk or color over between the LEDs 4a-4c occurs, reducing the contrast of the lighting device 2.

Figure 3:
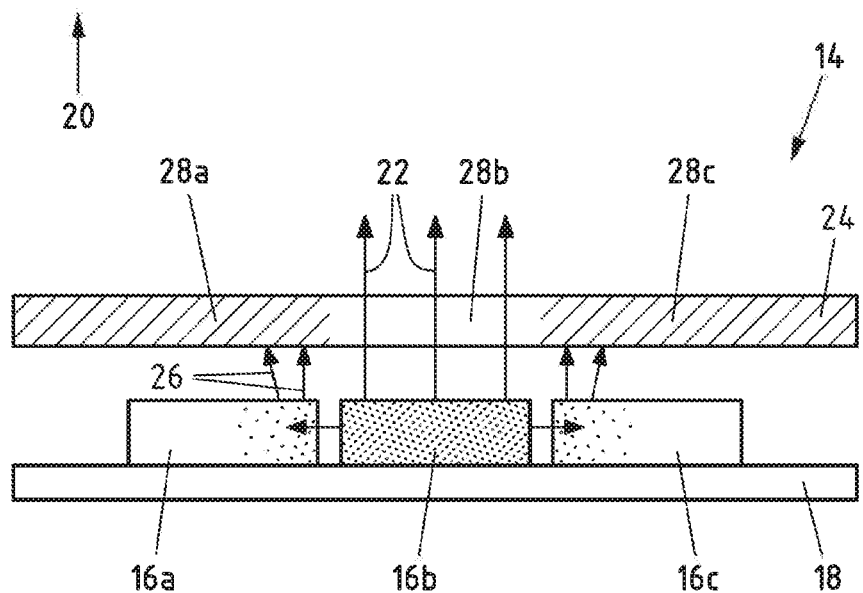
FIG. 3 shows a schematic representation of a first embodiment of a lighting device according to the invention from a side view.
Figure 4:
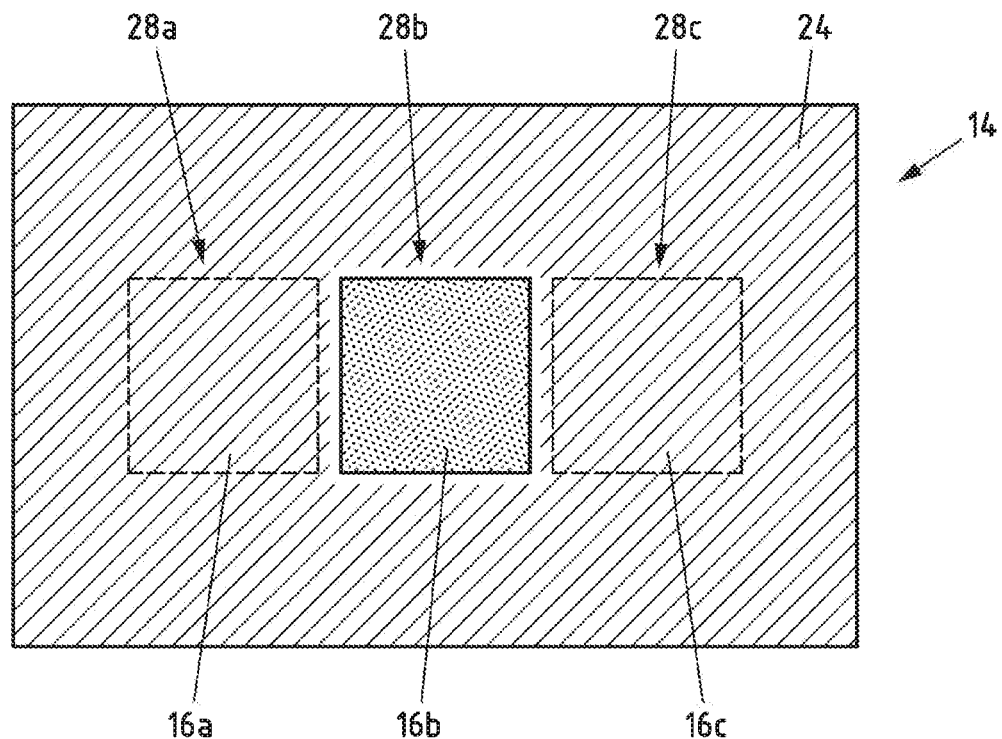
FIG. 4 shows a schematic representation of the first of embodiment of the lighting device from a top view.

FIG. 3 shows a schematic representation of a lighting device 14 according to the invention from a side view. FIG. 4 shows the corresponding top view. A light-emitting module with light-emitting elements 16a-16c and a substrate 18 is provided. The light-emitting elements 16a-16c are arranged adjacent to each other on the substrate 18, such that the light-emitting elements 16a-16c are configured to emit light towards a light-emitting side 20. The light-emitting module is configured such that the light-emitting elements 16a-16c can be addressed independently of each other in that some of the light-emitting elements 16a-16c may be brought into a switched-on state while other light-emitting elements 16a-16c may be brought into a switched-off state. For example, each light-emitting element 16a-16c has electrical connection elements (not shown) that allow for an independent supply with electrical energy and therefore an independent activation of the light-emitting elements 16a-16c. The light-emitting elements 16a-16c may comprise LEDs and/or LED packages. The light-emitting module may therefore represent a segmented LED module in that segments of LEDs may be addressed independently. In FIGS. 3 and 4, light-emitting element 16b is in the switched-on state and emits light as indicated by the arrows 22, while light-emitting elements 16a and 16c are in the switched-off state and are inactive.

A top layer 24 is disposed on the light-emitting module at the light-emitting side 20, wherein the top layer 24 comprises a switching material capable of a reversible change in transmittance for the light emitted by the light-emitting elements 16a-16c. As described above in conjunction with FIGS. 1 and 2, lateral light diffusion occurs and light emitted by the light-emitting element 16b is not only emitted towards the light emitting side 20, but is also emitted laterally, reflected, and/or scattered away from the light-emitting side 20. Light may therefore leak to the inactive light-emitting elements 16a, 16c and parts of the inactive light-emitting elements 16a, 16c would appear illuminated with light 26. As the top layer 24 is configured to change to a higher transmittance in a region 28b of the top layer situated on light-emitting element 16b in the switched-on state compared to a transmittance in regions 28a, 28c of the top layer situated on the light-emitting elements 16a, 16c in the switched-off state, the light 26 originating from the lateral light diffusion of the light-emitting element 16b is at least partially blocked at the regions 28a, 28c of the top layer with a lower transmittance. In particular, a substantial part of the light 26 may be scattered and/or absorbed at the regions 28a, 28c of the top layer 24, while a substantial part of the light 22 may be transmitted through the region 28b of the top layer 24. In particular, the region 28b of the top layer 24 situated on light-emitting element 16b in the switched-on state has translucent properties.

Figure 5:
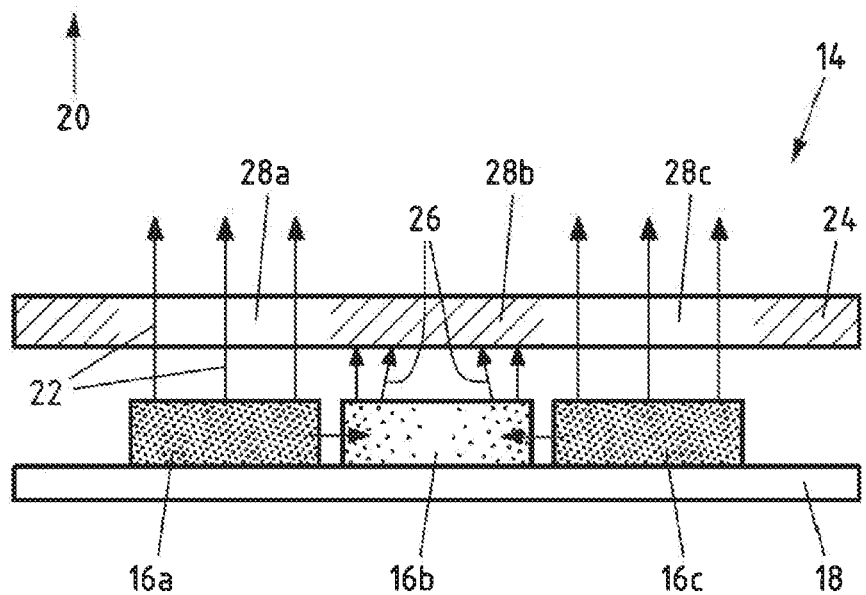
FIG. 5 shows a schematic representation of the first of embodiment of the lighting device with a different state of the light-emitting elements from a side view.
Figure 6:
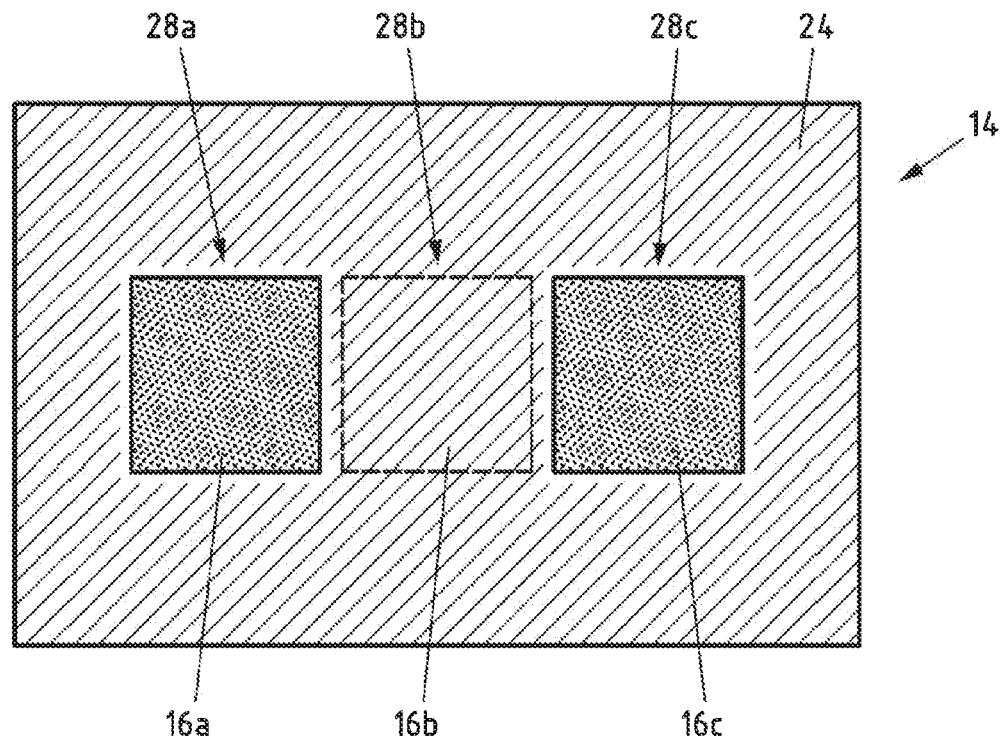
FIG. 6 shows a schematic representation of the first of embodiment of the lighting device with a different state of the light-emitting elements from a top view.

The switching material is capable of a reversible change in transmittance, such that the transmittance of the regions 28a-28c of the top layer 24 may be changed or switched according to the choice of light-emitting elements 16a-16c being active. FIGS. 5 and 6 show a side view and top view, respectively, of the lighting device 16 with light-emitting elements 16a, 16c in the switched-on state and light-emitting element 16b in the switched-off state. Accordingly, the top layer 24 changes to a higher transmittance in the regions 28a, 28c of the top layer situated on light-emitting elements 16a, 16c in the switched-on state compared to a transmittance in region 28b of the top layer situated on light-emitting element 28b in the switched-off state.

The switching material may in particular comprise at least one thermochromic material such as at least one leuco dye and/or at least one metal oxide capable of changing the transmittance with temperature. The at least one thermochromic material may be configured to change transmittance at temperatures corresponding to an operating temperature of the light-emitting elements 16a-16c such that the waste heat produced by the light-emitting elements 16a-16c, and in particular white LEDs with phosphor as wavelength conversion element is sufficient to induce the change in transmittance. The switching material is in particular encapsulated. Encapsulated leuco dyes may for instance be integrated into the top layer 24 or provided as a coating on the top layer 24.

As an alternative or in addition, the switching material may comprise at least one electrochromic material, such as metal oxides, metal hydroxides, viologens, conjugated polymers, metal coordination complexes, metal hexacyanometallates, and/or metal pthalocyanines. The at least one electrochromic material may be configured to change to a higher or a lower transmittance when a voltage is applied to the top layer 24. Voltage can be applied to the regions 28a-28c of the top layer 24 to induce the change in transmittance.

The light-emitting module may further comprise at least one light-blocking element such as a reflective element arranged between the light-emitting elements 16a-16c to provide additional contrast.

The lighting 14 may be configured as adaptive camera flash light, for instance in the field of photography, or as automotive lighting and in particular as an automotive headlight.

What is claimed is:

1. A lighting device, comprising:
   a light-emitting module having independently-addressable adjacent light-emitting elements without a reflective barrier disposed therebetween, the light-emitting elements being configured to emit light towards a light-emitting side; and
   a top layer disposed on the light-emitting module at the light-emitting side, the top layer comprising a switching material capable of a reversible change in transmittance for the light emitted by the light-emitting elements, the top layer being controllable to individually change to a higher transmittance in regions of the top layer situated on each of light-emitting elements in a switched-on state compared to a transmittance in regions of the top layer situated on each of light-emitting elements in a switched-off state, the switching material having a porous structure that comprises:
   a non-light absorbing material structure having a plurality of sub-micron pores, and
   a polymer matrix filling the sub-micron pores, a difference between a refractive index of the non-light absorbing material structure and a refractive index of the polymer matrix changeable with temperature.

2. The lighting device according to claim 1, wherein the regions of the top layer situated on light-emitting elements in the switched-on state have translucent properties.

3. The lighting device according to claim 1, wherein the switching material comprises at least one thermochromic material.

4. The lighting device according to claim 1, wherein the switching material comprises at least one electrochromic material.

5. The lighting device according to claim 1, wherein the top layer is configured to change transmittance by at least 30%.

6. The lighting device according to claim 1, wherein the non-light absorbing material comprises porous silica.

7. The lighting device according to claim 1, wherein the light-emitting module further comprises at least one light-blocking element arranged between the light-emitting elements.

8. The lighting device according to claim 1, wherein the lighting device is disposed in an automotive headlight.

9. The lighting device according to claim 1, wherein the non-light absorbing material structure is formed from a plurality of micron-sized porous silica particles, the plurality of sub-micron pores located within the plurality of micron-sized porous particles.

10. The lighting device according to claim 1, wherein the non-light absorbing material structure forms a mesh slab comprising an interconnected network of the plurality of sub-micron pores and air voids therebetween, a space occupied by the air voids decreasing as the polymer matrix thermally expands, decreasing light scatter, and increasing as the polymer matrix shrinks, increasing light scatter.

11. The lighting device according to claim 1, wherein the switching material comprises magnesium fluoride ($MgF_2$) scattering elements embedded in a dimethylsilicone matrix material.

12. The lighting device according to claim 3, wherein the at least one thermochromic material is configured to change transmittance at temperatures corresponding to an operating temperature of the light-emitting elements.

13. The lighting device according to claim 3, wherein the at least one thermochromic material comprises at least one material including materials of leuco dye and at least one metal oxide.

14. The lighting device according to claim 3, wherein the at least one thermochromic material comprises at least one leuco dye encapsulated in substantially spherical capsules having an average dimension of about 5 μm to about 10 μm.

15. The lighting device according to claim 3, wherein the at least one thermochromic material comprises at least one leuco dye disposed on a porous structure.

16. The lighting device according to claim 4, wherein the at least one electrochromic material is configured to change to a higher transmittance when a voltage is applied to the top layer.

17. The lighting device according to claim 4, wherein the at least one electrochromic material comprises at least one material selected from a group of materials comprising metal oxides, metal hydroxides, viologens, conjugated polymers, metal coordination complexes, metal hexacyanometallates, and metal pthalocyanines.

18. The lighting device according to claim 6, wherein the at least one electrochromic material is configured to change to a lower transmittance when a voltage is applied to the top layer.

19. The lighting device according to claim 4, wherein the at least one electrochromic material is configured to change to a lower transmittance when a voltage is applied to the top layer.

20. The lighting device according to claim 9, wherein the plurality of micron-sized porous particles each have a diameter of about 10 mm to about 50 mm and each sub-micron pore has an internal diameter of about 50 nm to about 400 nm.

21. A method for producing a lighting device, the method comprising:

providing a light-emitting module by arranging independently-addressable light-emitting elements adjacent to each other without a reflective barrier disposed therebetween such that the light-emitting elements emit light towards a light-emitting side;

providing a top layer comprising a switching material capable of a reversible change in transmittance for the light emitted by the light-emitting elements, the switching material having a porous structure that includes a non-light absorbing material structure having a plurality of sub-micron pores, and a polymer matrix filling the sub-micron pores, a difference between a refractive index of the non-light absorbing material structure and a refractive index of the polymer matrix changeable with temperature; and controlling the top layer on the light-emitting module at the light-emitting side to individually change to a higher transmittance in regions of the top layer situated on each of light-emitting elements in a switched-on state compared to a transmittance in regions of the top layer situated on each of light-emitting elements in a switched-off state.

* * * * *